United States Patent
Fukumizu

(10) Patent No.: US 8,274,821 B2
(45) Date of Patent: Sep. 25, 2012

(54) NONVOLATILE MEMORY DEVICE

(75) Inventor: Hiroyuki Fukumizu, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 12/725,515

(22) Filed: Mar. 17, 2010

(65) Prior Publication Data

US 2010/0238710 A1  Sep. 23, 2010

(30) Foreign Application Priority Data

Mar. 18, 2009  (JP) .................................. 2009-66173

(51) Int. Cl.
*G11C 11/00* (2006.01)
(52) U.S. Cl. ........................ 365/163; 365/158
(58) Field of Classification Search .................. 365/163, 365/158; 369/126
See application file for complete search history.

(56) References Cited

U.S. PATENT DOCUMENTS

| | | | | |
|---|---|---|---|---|
| 5,373,494 A | * | 12/1994 | Kawagishi et al. | 369/126 |
| 5,610,898 A | * | 3/1997 | Takimoto et al. | 369/126 |
| 7,223,688 B2 | * | 5/2007 | Lowrey et al. | 438/623 |
| 2007/0133358 A1 | | 6/2007 | Kubo et al. | |
| 2008/0068743 A1 | | 3/2008 | Kubo et al. | |
| 2008/0231986 A1 | | 9/2008 | Aoki et al. | |
| 2008/0253269 A1 | | 10/2008 | Koga et al. | |

FOREIGN PATENT DOCUMENTS

| | | |
|---|---|---|
| JP | 44-5784 | 3/1969 |
| JP | 8-297871 | 11/1996 |
| JP | 2005-203083 | 7/2005 |
| JP | 2006-269056 | 10/2006 |
| JP | 2007-42188 | 2/2007 |
| JP | 2007-273618 | 10/2007 |
| JP | 2008-59699 | 3/2008 |
| JP | 2008-84512 | 4/2008 |
| JP | 2008-234768 | 10/2008 |
| JP | 2008-273272 | 10/2008 |

OTHER PUBLICATIONS

Office Action issued Apr. 1, 2011, in Japan Patent Application No. 2009-066173 (with English translation).

* cited by examiner

*Primary Examiner* — Son Dinh
(74) *Attorney, Agent, or Firm* — Oblon, Spivak, McClelland, Maier & Neustadt, L.L.P.

(57) ABSTRACT

A nonvolatile memory device, includes: a memory layer having a resistance changeable by performing at least one selected from applying an electric field and providing a current, the storage layer having a first major surface; a plurality of first electrodes provided on the first major surface; a plurality of probe electrodes disposed to face the plurality of first electrodes, the plurality of probe electrodes having a changeable relative positional relationship with the first electrodes; a drive unit connected to the plurality of probe electrodes to record information in the memory layer by causing at least the one selected from the electric field and the current between at least two of the plurality of first electrodes via the plurality of probe electrodes, the electric field having a component parallel to the first major surface, the current flowing in a direction having a component parallel to the first major surface.

19 Claims, 10 Drawing Sheets

NONVOLATILE MEMORY DEVICE

CROSS-REFERENCE TO RELATED APPLICATIONS

This application is based upon and claims the benefit of priority from the prior Japanese Patent Application No. 2009-066173, filed on Mar. 18, 2009; the entire contents of which are incorporated herein by reference.

BACKGROUND

1. Field

Embodiments of the present invention relate generally to a nonvolatile memory device.

2. Background Art

The NAND flash memory market has rapidly expanded due to increasing memory capacities and decreasing prices; and in recent years, NAND flash memory has encountered problems such as downsizing limitations and increasing process costs due to decreasing minimum line widths. The development of a new nonvolatile memory is expected to solve such problems.

For example, memory devices have been proposed to combine a probe array with a recording medium formed from a resistance change material having a changeable resistance (for example, refer to JP-A 2007-273618 (Kokai)).

In such a conventional probe memory, information is recorded in and read from a recording layer by applying an electric field or providing a current between a probe electrode and a substrate electrode in a direction perpendicular to the layer of the recording layer; and good characteristics may not always be obtained due to the characteristics of the material of the recording layer. Moreover, to realize memories of even higher density, there is room for further improvement; and development of a nonvolatile memory device having a new structure is necessary.

SUMMARY

According to an aspect of the invention, there is provided a nonvolatile memory device, including: a memory layer having a resistance changeable by performing at least one selected from applying an electric field and providing a current, the storage layer having a first major surface; a plurality of first electrodes provided on the first major surface; a plurality of probe electrodes disposed to face the plurality of first electrodes, the plurality of probe electrodes having a changeable relative positional relationship with the first electrodes; a drive unit connected to the plurality of probe electrodes to record information in the memory layer by causing at least the one selected from the electric field and the current between at least two of the plurality of first electrodes via the plurality of probe electrodes, the electric field having a component parallel to the first major surface, the current flowing in a direction having a component parallel to the first major surface.

DETAILED DESCRIPTION

Figure 1A:
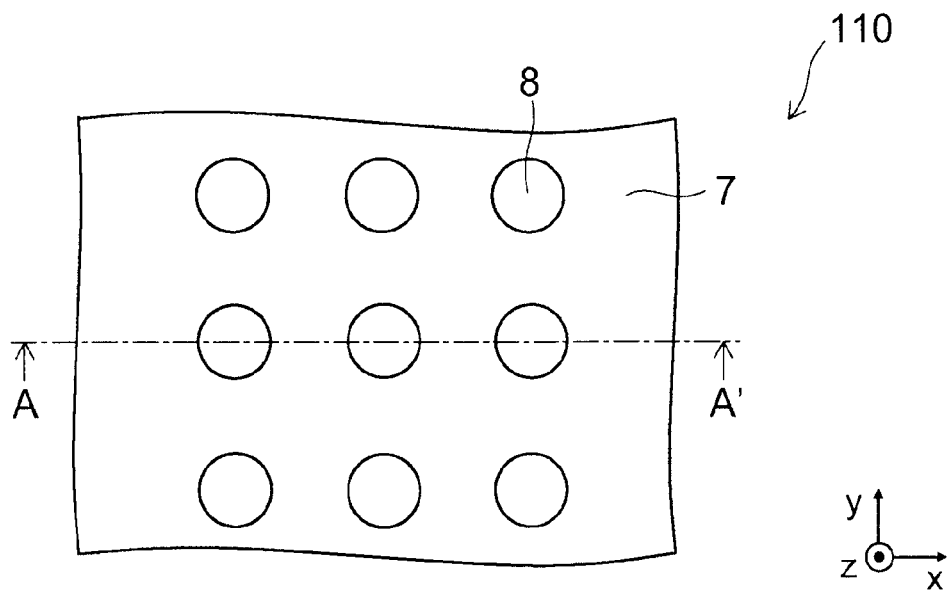
FIGS. 1A and 1B are schematic views illustrating the configuration of a nonvolatile memory device according to an embodiment of the invention

Embodiments of the invention will now be described in detail with reference to the drawings.

In the specification of the application and the drawings, components similar to those described in regard to a drawing thereinabove are marked with like reference numerals, and a detailed description is omitted as appropriate.

An Embodiment

Figure 1B:
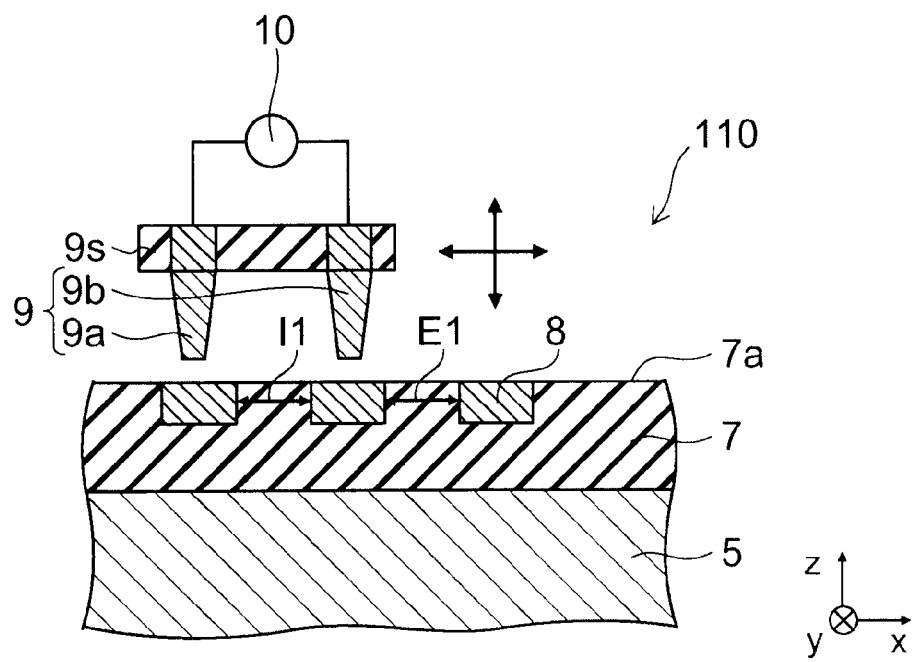

FIGS. 1A and 1B are schematic views illustrating the configuration of a nonvolatile memory device according to an embodiment of the invention.

Namely, FIG. 1A is a plan view; and FIG. 1B is a cross-sectional view along line A-A' of FIG. 1A.

As illustrated in FIGS. 1A and 1B, a nonvolatile memory device 110 of the embodiment of the invention includes a memory layer 7 having a changeable resistance, multiple first electrodes 8 provided in an upper face (a first major surface 7a) of the memory layer 7, multiple probe electrodes 9, and a drive unit 10. The probe electrodes 9 and the drive unit 10 are omitted in FIG. 1A.

The memory layer 7 is provided on, for example, a substrate 5. As described below, the memory layer 7 is a layer having a resistance changeable by at least one selected from applying an electric field and providing a current.

The memory layer 7 may include, for example, $NiO_x$, $TiO_x$, $CoO_x$, $TaO_x$, $MnO_x$, $WO_x$, $Al_2O_3$, $FeO_x$, $HfO_x$, $ZnMn_2O_4$, $ZnFe_2O_4$, $ZnCO_2O_4$, $ZnCr_2O_4$, $ZnAl_2O_4$, $CuCoO_2$, $CuAlO_2$, $NiWO_4$, $NiTiO_3$, $CoAl_2O_4$, $MnAl_2O_4$, $ZnNiTiO_4$, $Pr_xCa_{1-x}MnO_3$, SiC and the like.

The memory layer 7 may include ones with a dopant added to the various metal compounds recited above.

However, the invention is not limited thereto. The memory layer 7 may include any material having a resistance changeable by at least one selected from applying an electric field and providing a current. The memory layer 7 also may include a so-called phase change material which has a resistance changeable according to the change of a phase state caused by at least one selected from applying an electric field and providing a current. Thus, a material having a resistance changeable according to a phase change also is taken to be a resistance change material.

The first electrodes 8 may include, for example, tungsten, platinum, and the like. However, the invention is not limited thereto. The first electrodes 8 may include any material. Although the first electrodes 8 in this specific example are buried in the memory layer 7 such that the first major surface 7a of the memory layer 7 is substantially in the same plane as the upper face of the first electrodes 8, the invention is not limited thereto. The upper face of the first electrodes 8 may be recessed from the first major surface 7a of the memory layer 7 or may protrude.

The probe electrodes 9 are disposed to face the multiple first electrodes 8 and include, for example, a probe electrode 9a and a probe electrode 9b provided on a probe substrate 9s. The probe electrodes 9 have a changeable relative positional relationship with the first electrode 8. The probe electrodes 9 may include, for example, a probe used in an atomic force microscope. The entire probe electrodes 9 may be electrically conductive, or the surfaces of the tips of the probe electrodes 9 on the side facing the memory layer 7 may be covered with an electrically conductive thin film. The probe electrodes 9 may include materials such as, for example, silicon, carbon nanotubes, and tungsten. The tips of the probe electrodes 9 may be finely fashioned.

The drive unit 10 is connected to the multiple probe electrodes 9 (the probe electrode 9a and the probe electrode 9b). The drive unit 10 records information in the memory layer 7 by applying a voltage to the multiple first electrodes 8 via the multiple probe electrodes 9 to provide at least one selected from an electric field (e.g., an electric field E1) having a component parallel to the first major surface 7a and a current (e.g., a current I1) flowing in a direction having a component parallel to the first major surface 7a.

An XYZ orthogonal coordinate system will now be introduced for convenience of description in the specification of the application. In this coordinate system, one direction in a plane parallel to the first major surface 7a of the memory layer 7 is taken as an X axis direction (first direction). A direction perpendicular to the X axis direction in a plane parallel to the first major surface 7a is taken as a Y axis direction (second direction). A direction perpendicular to the X axis direction and the Y axis direction is taken as a Z axis direction (third direction). In other words, the first major surface 7a is parallel to an X-Y plane; and the first major surface 7a is perpendicular to the Z axis direction.

In this specific example, the first electrodes 8 are arranged in a matrix configuration in the X axis direction and the Y axis direction in the X-Y plane. However, the invention is not limited thereto. It is sufficient that the first electrodes 8 are multiply provided in the first major surface 7a; and the number and disposition thereof are arbitrary. Hereinbelow, the case is described where the first electrodes 8 are arranged in a matrix configuration in the X axis direction and the Y axis direction.

The probe electrodes 9, for example, are movable in the X-Y plane above the memory layer 7. The probe electrodes 9 are configured to contact any of the first electrodes 8. In such a case, the probe electrodes 9 also may be configured to be movable in the Z axis direction, that is, vertically above the memory layer 7 and the first electrodes 8. Thereby, the contact and non-contact between the first electrodes 8 and the probe electrodes 9 can be controlled. However, a configuration may be used in which the probe electrode 9 has a fixed position in the Z axis direction to be constantly in contact with the memory layer 7 or the first electrodes 8.

Figure 2:
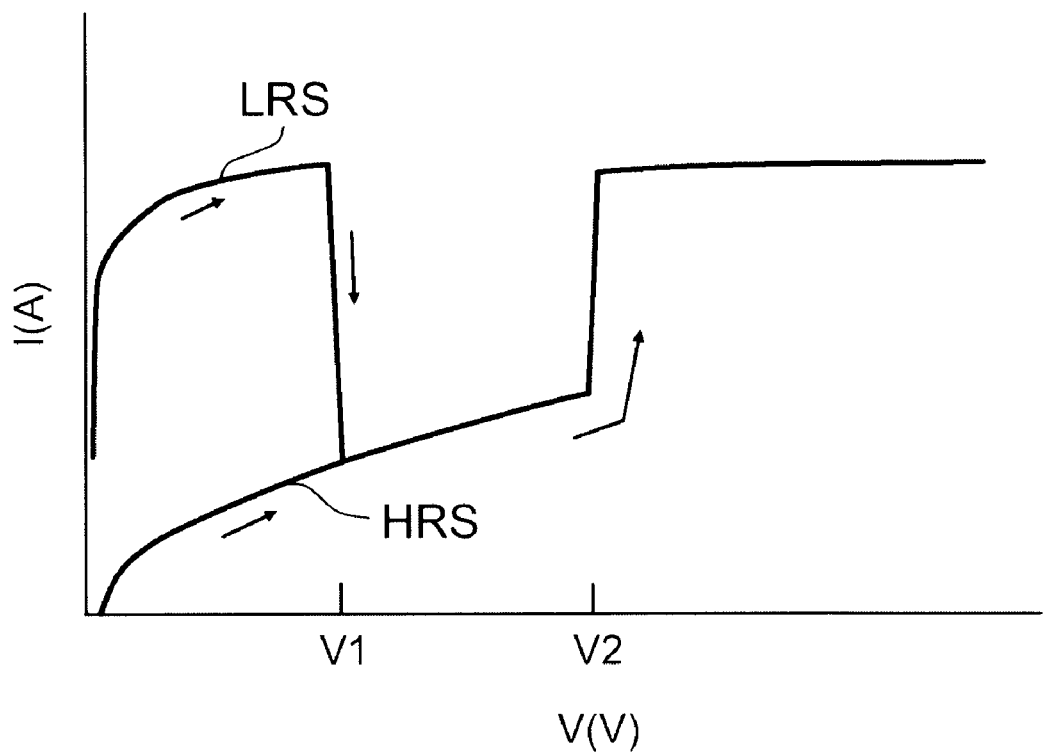
FIG. 2 is a schematic graph illustrating characteristics of the nonvolatile memory device according to the embodiment of the invention.

FIG. 2 is a schematic graph illustrating characteristics of the nonvolatile memory device according to the embodiment of the invention.

Namely, FIG. 2 illustrates characteristics of the memory layer 7 of a nonvolatile memory device 110. A voltage V applied to the memory layer 7 is plotted on the horizontal axis. A current I flowing in the memory layer 7 is plotted on the vertical axis. The current I of the vertical axis is illustrated as a logarithm.

As illustrated in FIG. 2, the initial state of the memory layer 7 is taken to be a high resistance state HRS. When the voltage V applied to the memory layer 7 reaches a second transition voltage V2, the high resistance state HRS transitions to a relatively low resistance state, i.e., a low resistance state LRS.

The low resistance state LRS is maintained even when the applied voltage V is removed. As the voltage V is increased from 0 V to a first transition voltage V1, the low resistance state LRS transitions to the high resistance state HRS.

Thus, the memory layer 7 includes multiple states having different resistances. Although the memory layer 7 of this specific example has the two states of the high resistance state HRS and the low resistance state LRS, three or more different resistances may be used.

Although FIG. 2 illustrates characteristics in the case where a direct current voltage is applied to the memory layer 7, an extremely short pulse voltage may be applied to the memory layer 7 to operate the nonvolatile memory device 110.

The memory layer 7 and the first electrode 8 may be constructed, for example, as follows.

A resistance change film (e.g., NiOx) forming the memory layer 7 is formed on the substrate 5; and a hole pattern subsequently is made in the resistance change film by lithography and dry etching. Subsequently, an electrically conducting material of W (tungsten) forming the first electrodes 8 is buried in the holes by, for example, CVD (Chemical Vapor Deposition) and planarized by, for example, CMP (Chemical Mechanical Polishing). Thereby, the structure illustrated in FIGS. 1A and 1B in which the first electrodes 8 are buried in the memory layer 7 can be formed.

The probe electrodes 9 are multiply provided in the nonvolatile memory device 110. An example of a disposition of the probe electrodes 9 will now be described.

Figure 3A:
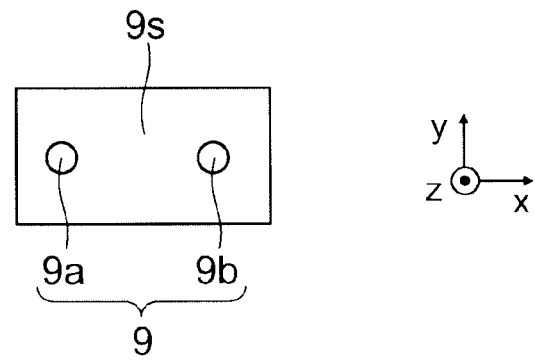
FIGS. 3A to 3C are schematic plan views illustrating configurations of portions of the nonvolatile memory device according to the embodiment of the invention.
Figure 3B:
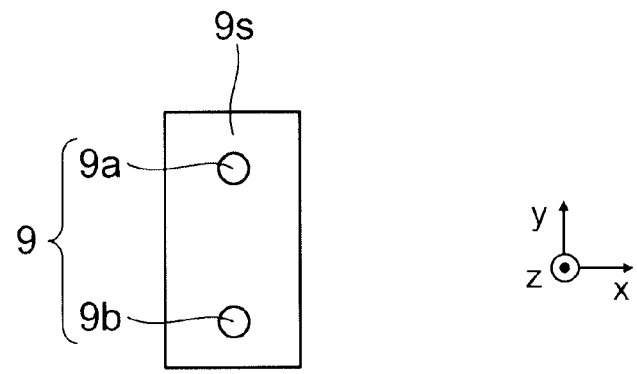
Figure 3C:
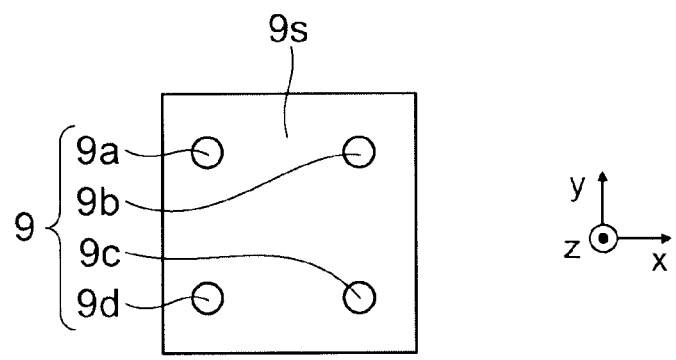

FIGS. 3A to 3C are schematic plan views illustrating configurations of portions of the nonvolatile memory device according to the embodiment of the invention.

Namely, FIGS. 3A to 3C illustrate examples having different dispositions of the multiple probe electrodes 9 in the nonvolatile memory device 110. FIGS. 3A to 3C illustrate the planar disposition of the tip portions of the probe electrodes 9 of the probe substrate 9s.

As illustrated in FIG. 3A, the probe electrodes 9a and 9b forming the multiple probe electrodes 9 may be arranged in a line in the X axis direction. In such a case, the pitch between the probe electrodes 9a and 9b may be set to be the pitch of the first electrodes 8 in the X axis direction multiplied by an integer (including a factor of unity, i.e., where the pitches are the same). Thereby, the contact of the probe electrodes 9a and 9b with the first electrodes 8 can be performed appropriately.

As illustrated in FIG. 3B, the probe electrodes 9a and 9b may be arranged in a line in the Y axis direction. In such a case as well, the pitch between the probe electrodes 9a and 9b may be set to be the pitch of the first electrodes 8 in the Y axis direction multiplied by an integer (including a factor of unity, i.e., where the pitches are the same). Thereby, the contact of the probe electrodes 9a and 9b with the first electrodes 8 can be performed appropriately.

Further, as illustrated in FIG. 3C, four probe electrodes 9a to 9d aligned in the X axis direction and the Y axis direction may be used as the multiple probe electrodes 9. In such a case as well, the pitches between the probe electrodes 9a to 9d in the X axis direction and the Y axis direction may be set to be the pitches of the first electrodes 8 in the X axis direction and the Y axis direction multiplied by integers (including a factor of unity, i.e., the case where the pitches are the same).

Thus, the multiple probe electrodes 9 may be arranged in a matrix configuration in the X axis direction and the Y axis direction; and the number thereof is arbitrary.

The surface area (the surface area in a plane parallel to the first major surface 7a) of each of the first electrodes 8 may be set to be larger than the surface area (the surface area of the tip on the side facing the first major surface 7a) of each of the probe electrodes 9. Conversely, the surface area of each of the first electrodes 8 may be set to be smaller than the surface area of each of the probe electrodes 9. Thereby, the margin when positionally aligning each of the first electrodes 8 with each of the probe electrodes 9 can be enlarged. However, it is easy to fashion the tips of the probe electrodes 9 on the side facing the first major surface 7a to be relatively small. Therefore, it is practically desirable to make the surface area of each of the probe electrodes 9 smaller than the surface area of each of the first electrodes 8.

For example, the curvature radius of the tip of the probe electrode 9 may be small to increase the memory density per unit surface area and realize good contact between the first electrodes 8 and the probe electrodes 9. The curvature radius of the tip of the probe electrode 9 is, for example, about 15 nm. In such a case, the planar configuration of the tip of the probe electrode 9 has a diameter substantially about 15 nm. On the other hand, the diameter of the hole pattern provided in the memory layer 7 when forming the first electrodes 8 may be, for example, 50 nm. Thus, the surface area of each of the tips of the probe electrodes 9 may be smaller than the surface area of each of the first electrodes 8.

In the nonvolatile memory device 110 having a configuration such as that recited above, a voltage can be applied between the first electrodes 8 multiply disposed in the plane parallel to the first major surface 7a; and at least one selected from applying the electric field E1 and providing the current I1 to the memory layer 7 can be performed, where the electric field E1 has a component parallel to the first major surface 7a and the current I1 flows in a direction having a component parallel to the first major surface 7a.

On the other hand, as described above, in a probe memory of a comparative example of conventional art, an opposing electrode is disposed on the memory layer 7 on a side opposite to the first major surface 7a; and an electric field or a current is provided to the memory layer 7 between the opposing electrode and the probe electrode 9. In other words, in the case of the comparative example, an electric field is applied perpendicular to the first major surface 7a of the memory layer 7, or a current flows in a direction perpendicular to the first major surface 7a.

Conversely, in the memory layer 7 of the nonvolatile memory device 110 according to this embodiment, the electric field E1 is applied parallel to the first major surface 7a, or the current I1 flows in a direction parallel to the first major surface 7a; and the configuration different from that of conventional art may be used to perform operations different from those of conventional art.

For example, there may be cases where, depending on the characteristics of the material of the memory layer 7, the desired characteristics cannot be obtained by applying an electric field or providing a current in a direction perpendicular to the first major surface 7a of the memory layer 7, while the desired characteristics can be obtained by applying an electric field or providing a current in a direction parallel to the first major surface 7a of the memory layer 7. In such a case where the material is advantageous regarding performance, manufacturing processes, and cost, the material can be effectively put into practical use by using the nonvolatile memory device 110. In other words, according to the nonvolatile memory device 110, the selection range of, for example, the material and manufacturing processes of the memory layer 7 can be enlarged, resulting in extremely practical usefulness.

Moreover, by using the configuration of the nonvolatile memory device 110, it is possible to improve the memory density over that of conventional art as described below.

Figure 4A:
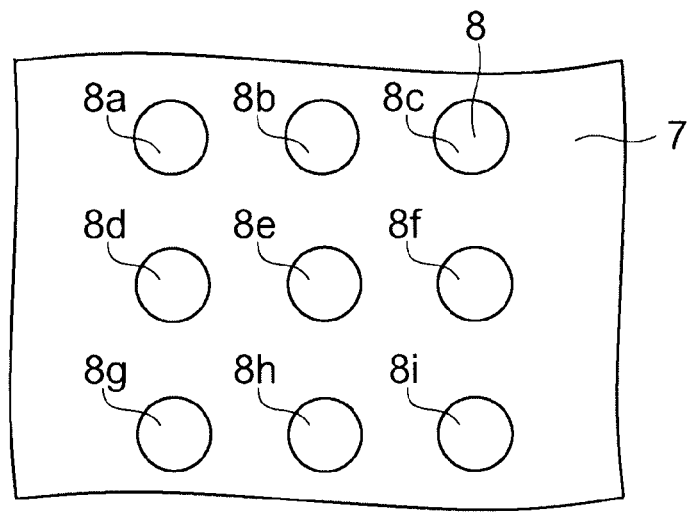
FIGS. 4A and 4B are schematic views illustrating the configuration of memory cells of the nonvolatile memory device according to the embodiment of the invention.
Figure 4B:
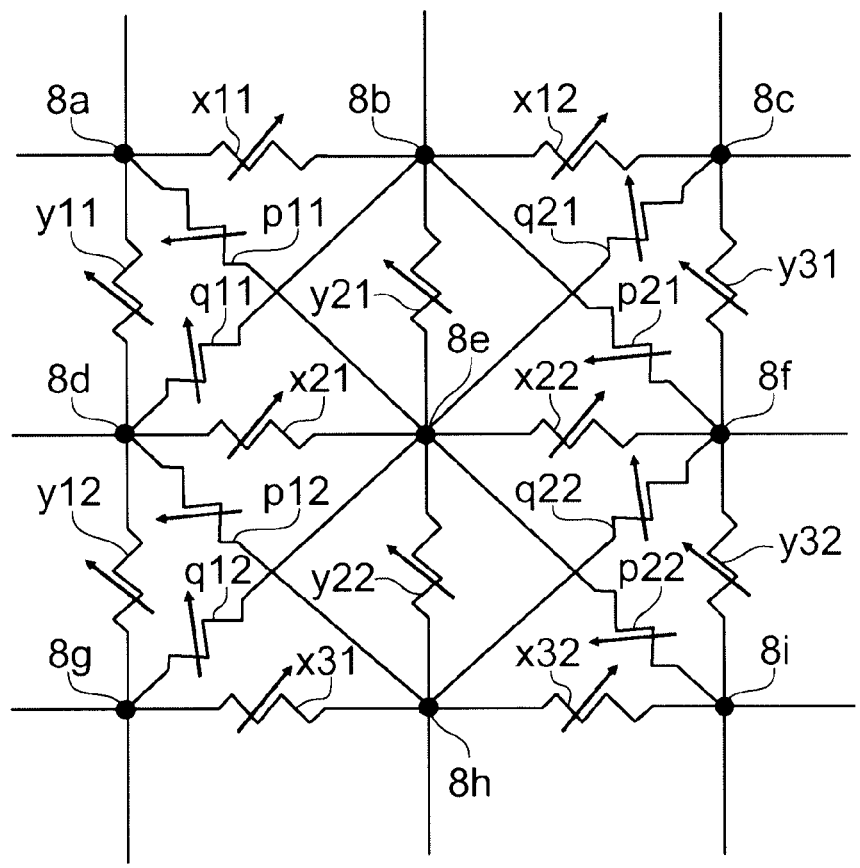

FIGS. 4A and 4B are schematic views illustrating the configuration of memory cells of the nonvolatile memory device according to the embodiment of the invention.

FIG. 4A illustrates the disposition of the first electrodes 8 of the nonvolatile memory device 110. FIG. 4B illustrates the configuration of memory cells of the nonvolatile memory device 110.

First, to simplify the description, an example will be described in which the first electrodes are disposed in a three by three matrix configuration (a total of nine electrodes) arranged in the X axis direction and the Y axis direction.

As illustrated in FIG. 4A, first electrodes 8a to 8c, first electrodes 8d to 8f, and first electrodes 8g to 8i disposed in the X axis direction are shifted and disposed in the Y axis direction.

In such a case, as illustrated in FIG. 4B, memory cells are formed among the mutually adjacent first electrodes 8a to 8i. Namely, a memory cell x11 is formed between the first electrode 8a and the first electrode 8b; and a memory cell x12 is formed between the first electrode 8b and the first electrode 8c. Similarly, memory cells x21, x22, x31, and x32 are formed among the first electrodes 8 adjacent in the X axis direction.

Similarly, memory cells y11, y12, y21, y22, y31, and y32 are formed among the first electrodes 8 adjacent in the Y axis direction.

Memory cells p11, p12, p21, p22, q11, q12, q21, and q22 are formed among the first electrodes 8 adjacent in the diagonal direction.

Thus, twenty memory cells are formed in the case where the first electrodes 8 are disposed in a three by three matrix configuration.

On the other hand, in the case where the first electrodes 8 are disposed in a three by three matrix configuration in a probe memory of the comparative example of conventional art in which the electric field is applied or the current flows in a direction perpendicular to the memory layer 7, the number of the memory cells is the same as the number of the first electrodes 8, i.e., nine.

Thus, according to the nonvolatile memory device 110, the number of memory cells formed can be more than that of conventional art even for the same number of first electrodes 8; and the memory density is improved.

For example, $(n-1) \times m$ memory cells are formed among the first electrodes 8 adjacent in the X axis direction and $n \times (m-1)$ memory cells are formed among the first electrodes 8 adjacent the Y axis direction, where n is the number (an integer of 2 or more) of the first electrodes 8 in the X axis direction and m is the number (an integer of 2 or more) in the Y axis direction. Among the first electrodes 8 adjacent in the diagonal direction, $2 \times (n-1) \times (m-1)$ memory cells are formed. In other words, a total of $(n-1) \times m + n \times (m-1) + 2 \times (n-1) \times (m-1)$ memory cells can be formed. In the case of the comparative example, the number of memory cells is n×m.

Thus, the nonvolatile memory device 110 according to this embodiment has a new structure to apply a voltage or provide a current in a direction parallel to the first major surface 7a of the memory layer 7. Thereby, a resistance change nonvolatile memory device capable of high density information recording can be provided.

Thus, in the nonvolatile memory device 110, the multiple first electrodes 8 are arranged in a matrix configuration in the X axis direction and the Y axis direction; and the multiple probe electrodes 9 are configured to contact the multiple first electrodes 8 mutually adjacent in at least one direction selected from the X axis direction and the Y axis direction.

The multiple probe electrodes 9 are further configured to contact the multiple first electrodes 8 mutually adjacent in a direction (i.e., the diagonal direction) different from the X axis direction and the Y axis direction.

Thereby, the memory layer 7 among the first electrodes 8 adjacent in the X axis direction, the Y axis direction, and the diagonal directions with respect to the X axis direction and the Y axis direction can be used as memory cells; and the high density information recording recited above is possible.

The distance between the first electrodes 8 is longer for the case where a voltage is applied among the first electrodes 8 disposed in a direction diagonal with respect to the X axis direction and the Y axis direction (referred to herein as "diagonal disposition") than for the case where a voltage is applied between the first electrodes 8 disposed parallel to the X axis direction and the Y axis direction (referred to as "parallel disposition"). In such a case, the resistance value, the first transition voltage V1, and the second transition voltage V2 are different among the first electrodes 8 for the parallel disposition and the diagonal disposition. Accordingly, the writing voltage, the erasing voltage, the resistance value of the high resistance state HRS, and the resistance value of the low resistance state LRS are different; and appropriate voltages and reading resistances may be set in the drive unit 10 according to the differences between the parallel disposition and the diagonal disposition.

Figure 5:
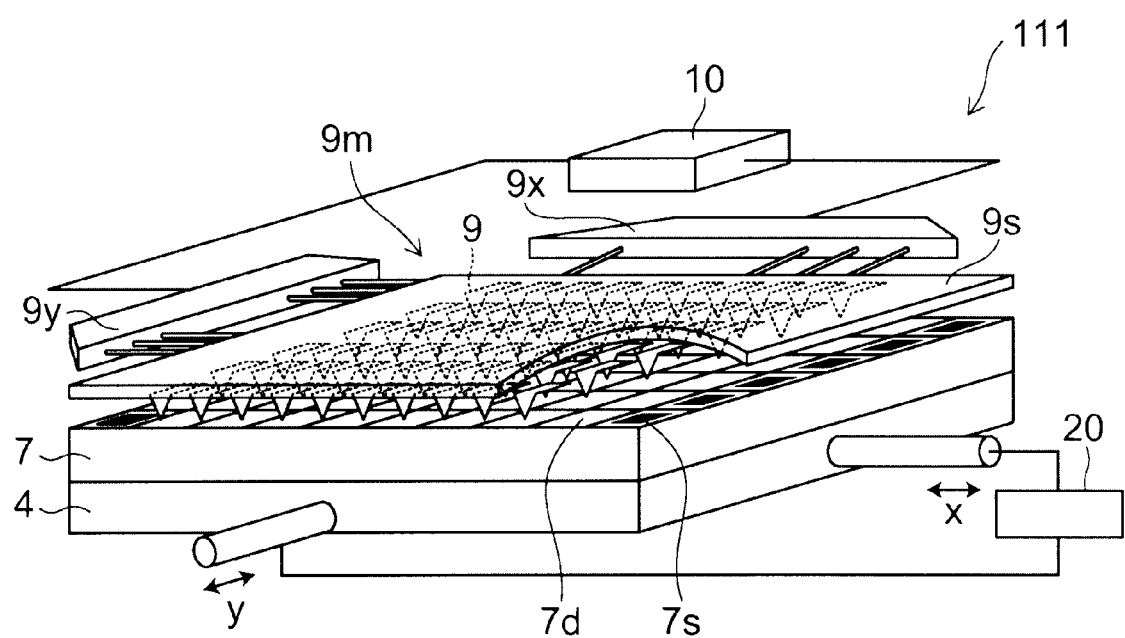
FIG. 5 is a schematic perspective view illustrating the configuration of another nonvolatile memory device according to the embodiment of the invention.
Figure 5:
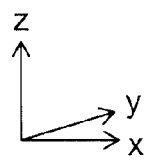

FIG. 5 is a schematic perspective view illustrating the configuration of another nonvolatile memory device according to the embodiment of the invention.

In another nonvolatile memory device 111 according to this embodiment, the memory layer 7 is disposed on an XY scanner 4 as illustrated in FIG. 5. For example, a data area 7d that stores data may be provided in the memory layer 7; and a servo area 7s for controlling operations of the probe electrodes 9 may be provided in the memory layer 7 outside of the data area.

A probe array 9m is disposed to face the memory layer 7.

The probe array 9m includes a probe substrate 9s and multiple probe electrodes 9 disposed in an array configuration on a major surface of the probe substrate 9s. Each of the multiple probe electrodes 9 includes, for example, a cantilever and is driven by multiplex drivers 9x and 9y.

Although it is possible to operate each of the multiple probe electrodes 9 individually using microactuators in the probe substrate 9s, all of the multiple probe electrodes 9 may have the same collective operation to access the data area 7d of the memory layer 7.

Using the multiplex drivers 9x and 9y, each of the probe electrodes 9 is moved, for example, in the X axis direction and the Y axis direction; and the positional information of the X axis direction and the Y axis direction is read from the servo area 7s of the memory layer 7. The positional information of the X axis direction and the Y axis direction is transferred to a driver 20.

The driver 20 can drive the XY scanner 4 based on the positional information to move the memory layer 7 in the X axis direction and the Y axis direction and positionally align the probe electrodes 9 and the first electrodes 8 of the memory layer 7.

For example, the probe electrodes 9 are moved to the desired position above the memory layer 7 in the state in which the probe electrodes 9 are raised away from the first electrodes 8. Subsequently, the probe electrodes 9 are lowered at the position of the desired first electrodes 8 and brought into contact with the first electrodes 8. Then, a voltage is applied to the multiple first electrodes 8 to perform the writing. Subsequently, the probe electrodes 9 are again moved to the location where the writing was performed to read or erase the written memory bit.

In other words, an electrical signal output by the drive unit 10 is applied to the first electrodes 8 via the probe electrodes 9 and the prescribed voltage is applied between the multiple first electrodes 8 in the state in which the probe electrodes 9 contact the desired first electrodes 8. Thereby, data can be written to, read from, and erased from the desired memory cell.

Data can be written, for example, by applying a voltage higher than the second transition voltage V2 of the characteristics illustrated in FIG. 2 to the memory layer 7. Erasing can be performed by applying a voltage higher than the first transition voltage V1 and lower than the second transition voltage V2. To read, a voltage lower than the first transition voltage V1 is applied to read the resistance of the memory layer 7 as being the high resistance state HRS or the low resistance state LRS.

In the nonvolatile memory device 111 as well, an electric field is applied or a current flows in a direction parallel to the first major surface 7a of the memory layer 7. Thereby, the selection range of, for example, the material and manufacturing processes of the memory layer 7 can be enlarged to provide a resistance change nonvolatile memory device having high density information recording.

Figure 6A:
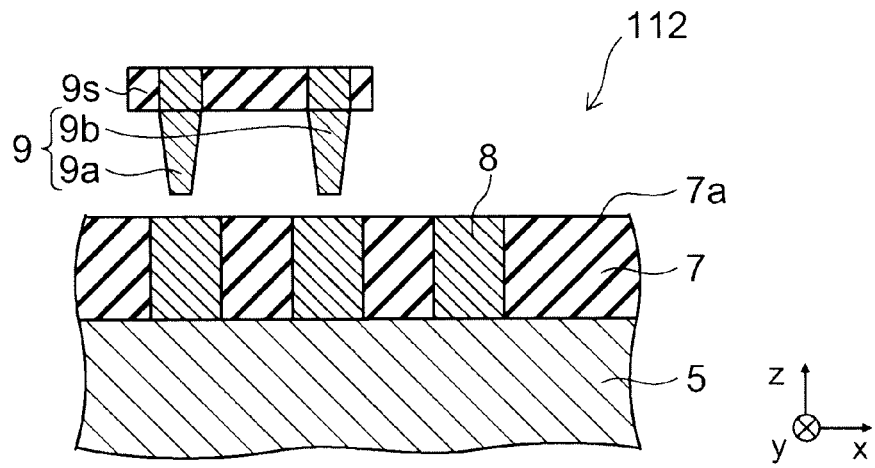
FIGS. 6A to 6C are schematic cross-sectional views illustrating configurations of other nonvolatile memory devices according to the embodiment of the invention.
Figure 6B:
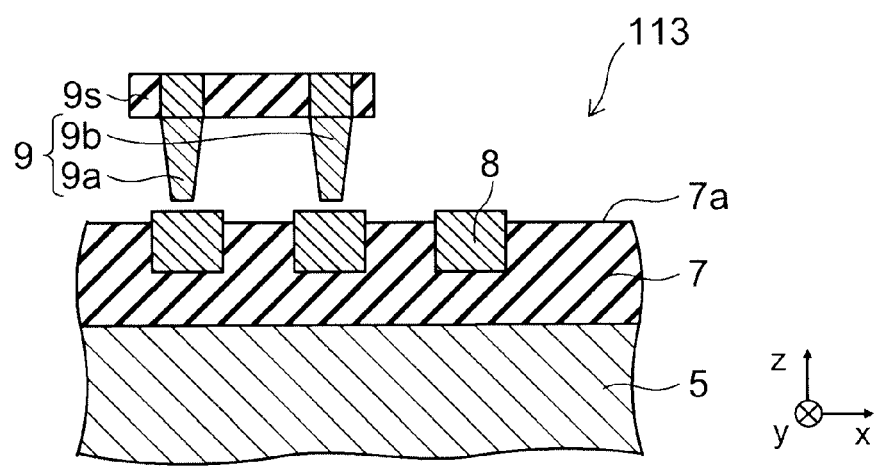
Figure 6C:
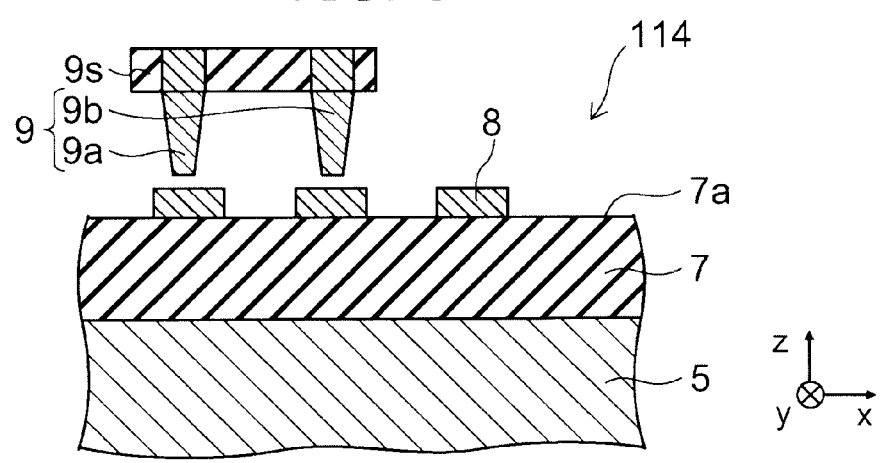

FIGS. 6A to 6C are schematic cross-sectional views illustrating configurations of other nonvolatile memory devices according to the embodiment of the invention.

Namely, FIGS. 6A, 6B, and 6C illustrate modifications of the configuration of the first electrode 8 of the nonvolatile memory device according to this embodiment and are cross-sectional views corresponding to the cross section along line A-A' of FIG. 1A. The drive unit 10 is omitted in these drawings.

In a nonvolatile memory device 112 of a modification according to this embodiment, the multiple first electrodes 8 pierce the memory layer 7 as illustrated in FIG. 6A. Thereby, the entire side faces of the first electrodes 8 can face the memory layer 7; the contact surface area between the first electrodes 8 and the memory layer 7 is enlarged; and the electric field E1 or the current I1 can be effectively provided to the memory layer 7 in the direction parallel to the X-Y plane.

In a nonvolatile memory device 113 of another modification, portions of the first electrodes 8 are buried in the memory layer 7 and the first electrodes 8 protrude from the memory layer 7 as illustrated in FIG. 6B. Thereby, the contact between the first electrodes 8 and the probe electrodes 9 can be performed reliably even in the case of large fluctuations of the position of the probe electrodes 9 in the Z axis direction.

In a nonvolatile memory device 114 of another modification, the first electrodes 8 are not buried in the memory layer 7 and are provided on the major surface 7a of the memory layer 7 as illustrated in FIG. 6C. In such a case as well, the first electrode 8 protrudes from the memory layer 7. In such a case as well, by a voltage applied between the first electrodes 8, the electric field E1 having a component parallel to the first major surface 7a is applied to the memory layer 7 or the current I1 flows in the memory layer 7 in a direction having a component parallel to the first major surface 7a.

Figure 7A:
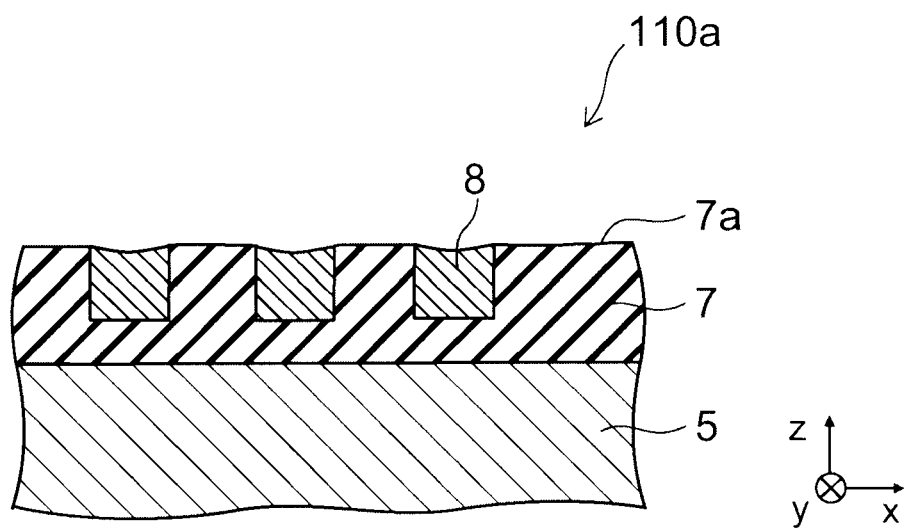
FIGS. 7A and 7B are schematic cross-sectional views illustrating configurations of other nonvolatile memory devices according to the embodiment of the invention.
Figure 7B:
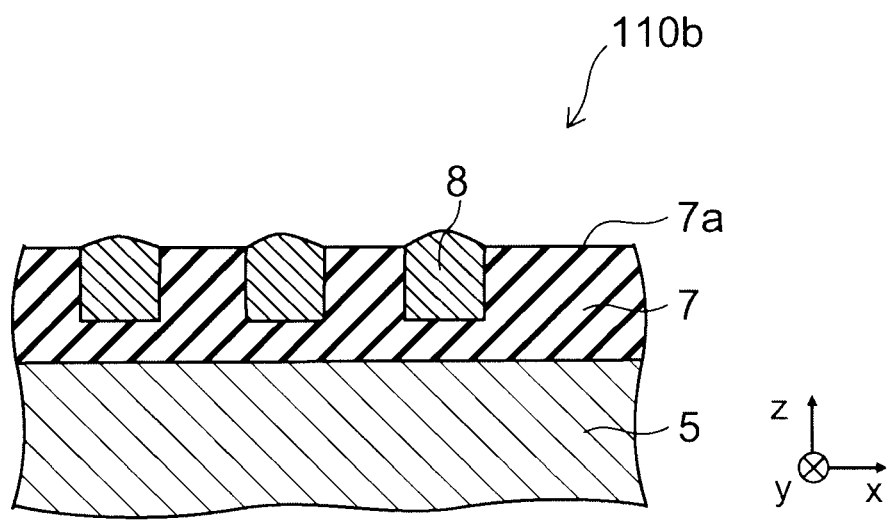

FIGS. 7A and 7B are schematic cross-sectional views illustrating configurations of other nonvolatile memory devices according to the embodiment of the invention.

Namely, FIGS. 7A and 7B illustrate modifications of the configuration of the first electrodes 8 of the nonvolatile memory device according to this embodiment and are cross-sectional views corresponding to the cross section along line A-A' of FIG. 1A. The drive unit 10 is omitted in these drawings.

In a nonvolatile memory device 110a of the modification, the central portion of the upper face (the surface on the side facing the probe electrodes 9) of each of the first electrodes 8 is recessed from the peripheral portion as illustrated in FIG. 7A. In other words, the central portion of the upper face of the first electrodes 8 may have a sunken configuration. Thereby, it is easy to positionally align with the probe electrodes 9; the contact surface area between the probe electrodes 9 and the first electrodes 8 can be enlarged; and the characteristics are more stable. As recited above, the configuration in which the central portion of the upper face of the first electrodes 8 is sunken may be applied to all of the structures of the first electrodes 8 described above.

In a nonvolatile memory device 110b of a modification, the upper face of the first electrodes 8 has a rounded protruding configuration as illustrated in FIG. 7B. Thereby, damage of the first electrodes 8 due to damage of corner portions of the upper face of the first electrodes 8 by the contact between the probe electrodes 9 and the first electrodes 8 can be suppressed. Thus, it is particularly favorable to apply the structure in which the upper face of the first electrodes 8 has a rounded protruding configuration to the nonvolatile memory devices 113 and 114 in which the first electrodes 8 protrude from the first major surface 7a.

Figure 8A:
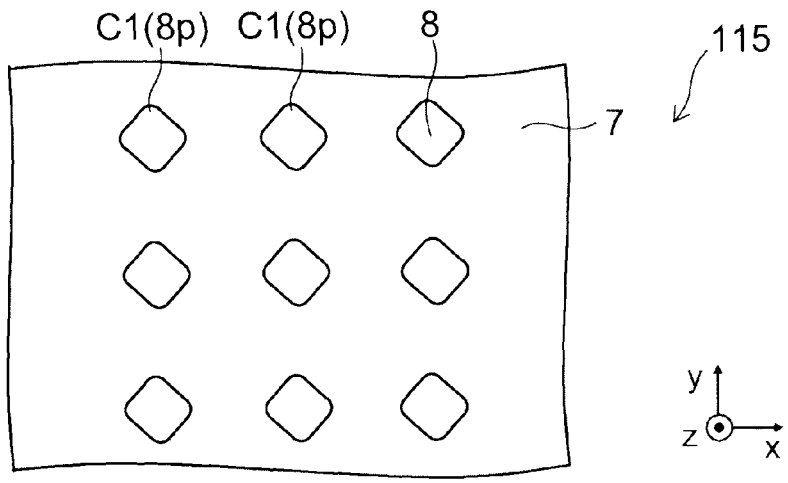
FIGS. 8A to 8C are schematic plan views illustrating the configurations of other nonvolatile memory devices according to the embodiment of the invention.
Figure 8B:
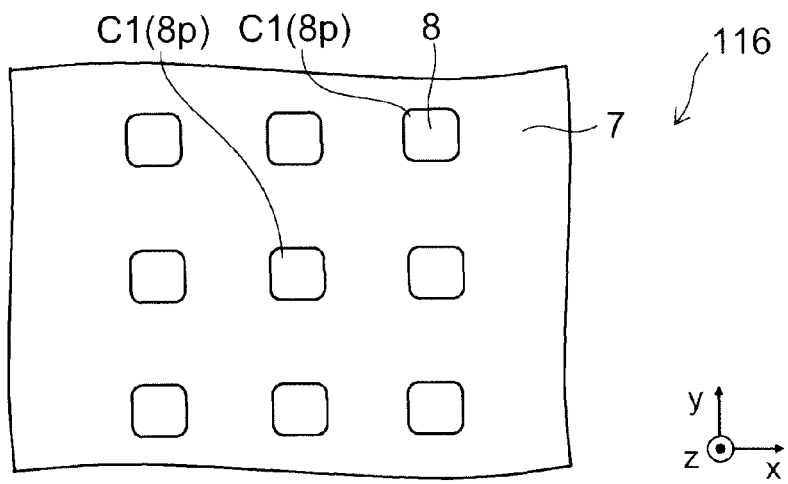
Figure 8C:
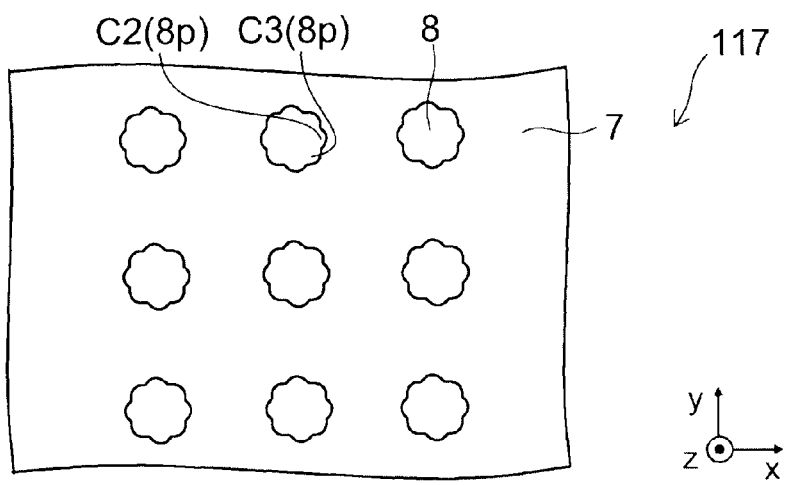

FIGS. 8A to 8C are schematic plan views illustrating the configurations of other nonvolatile memory devices according to the embodiment of the invention.

Namely, FIGS. 8A, 8B, and 8C illustrate various planar configurations of the first electrode 8 of the nonvolatile memory device according to this embodiment.

In a nonvolatile memory device 115 of the modification according to this embodiment, the planar configuration (the planar configuration as viewed from a direction perpendicular to the first major surface 7a) of the first electrode 8 is a square with rounded corners C1 as illustrated in FIG. 8A. The rounding of the corners C1 occurs when manufacturing the first electrode 8; and the configuration may be a square having corners C1 that are substantially not rounded.

The diagonal lines of the squares are disposed along the X axis direction and the Y axis direction.

Thereby, the first electrodes 8 mutually adjacent in the X axis direction and the Y axis direction oppose each other with the small surface areas of the portions of the square corners C1. Thereby, the electric field between the first electrodes 8 concentrates at the portions of the square corners C1; and the electric field or the current can be efficiently provided to the desired portions of the memory layer 7.

In such a case, the sides of the squares oppose each other across the diagonal directions with respect to the X axis direction and the Y axis direction. Therefore, the electric field between the first electrodes 8 in the diagonal directions with respect to the X axis direction and the Y axis direction does not concentrate relative to the X axis direction and the Y axis direction.

Thereby, the memory cell characteristics can be different for the directions parallel to the X axis direction and the Y axis direction and for the diagonal directions with respect to the X axis direction and the Y axis direction; and the margin of, for example, the driving conditions can be enlarged.

Thus, in the nonvolatile memory device 115, the multiple first electrodes 8 are arranged in a matrix configuration in the X axis direction and the Y axis direction; the multiple probe electrodes 9 are configured to contact the multiple first electrodes 8 mutually adjacent in at least one direction selected from the X axis direction and the Y axis direction; and the planar configuration of the multiple first electrodes 8 as viewed from a direction perpendicular to the first major surface 7a has a protruding portion 8p (the corner C1) protruding in at least one direction selected from the X axis direction and the Y axis direction. Thereby, the resulting electric field can be controlled; and the margin of the driving conditions can be enlarged.

In a nonvolatile memory device 116 of another modification, the planar configuration of the first electrode 8 is a square having (rounded) corners C1 as illustrated in FIG. 8B. In such a case, the sides of the squares are disposed along the X axis direction and the Y axis direction.

Thereby, the first electrodes 8 mutually adjacent in the direction diagonal with respect to the X axis direction and the Y axis direction oppose each other with the small surface areas of the portions of the square corners C1. Thereby, the electric field between the first electrodes 8 concentrates in the portions of the square corners C1; and the electric field or the current can be provided efficiently to the desired portions of the memory layer 7.

Conversely, the sides of the squares oppose each other in the directions along the X axis direction and the Y axis direction. Therefore, the electric field between the first electrodes 8 in the directions parallel to the X axis direction and the Y axis direction does not concentrate relative to the X axis direction and the Y axis direction.

Thereby, the memory cell characteristics can be different for the directions parallel to the X axis direction and the Y axis direction and for the diagonal directions with respect to the X axis direction and the Y axis direction; and the margin of, for example, the driving conditions can be enlarged.

In other words, in the nonvolatile memory device 116, the multiple first electrodes 8 are arranged in a matrix configuration in the X axis direction and the Y axis direction; the multiple probe electrodes 9 are also configured to contact the multiple first electrodes 8 mutually adjacent in a direction different from the X axis direction and the Y axis direction. The planar configuration of the multiple first electrodes 8 as viewed from a direction perpendicular to the first major surface 7a also has a protruding portion 8p (the corner C1) protruding in a direction different from the X axis direction and the Y axis direction. The resulting electric field can be controlled; and the margin of the driving conditions can be enlarged.

In a nonvolatile memory device 117 of another modification, the planar configuration of the first electrodes 8 has corners C2 (the protruding portion 8p) provided in the X axis direction and the Y axis direction and corners C3 (the protruding portion 8p) provided in directions diagonal with respect to the X axis direction and the Y axis direction as illustrated in FIG. 8C. In such a case, electric fields can be concentrated in the directions parallel to the X axis direction and the Y axis direction and the directions diagonal with respect to the X axis direction and the Y axis direction; the direction and the intensity of the electric fields can be more uniform; and a nonvolatile memory device can be obtained with stable characteristics.

Thus, in each of the cases of FIGS. 8A to 8C, the planar configuration of the multiple first electrodes 8 as viewed from a direction perpendicular to the first major surface 7a has a configuration protruding in at least one direction selected from an electric field and a current provided via multiple probe electrodes 9.

The planar configuration of the multiple first electrodes 8 as viewed from a direction perpendicular to the first major surface 7a has the protruding portion 8p to concentrate an electric field among the multiple first electrodes 8.

Thereby, electric fields can be concentrated among the first electrodes 8 in the X axis direction, the Y axis direction, and the directions diagonal with respect to the X axis direction and the Y axis direction.

Thus, various modifications of the planar configuration of the first electrodes 8 are possible.

Another Embodiment

Figure 9A:
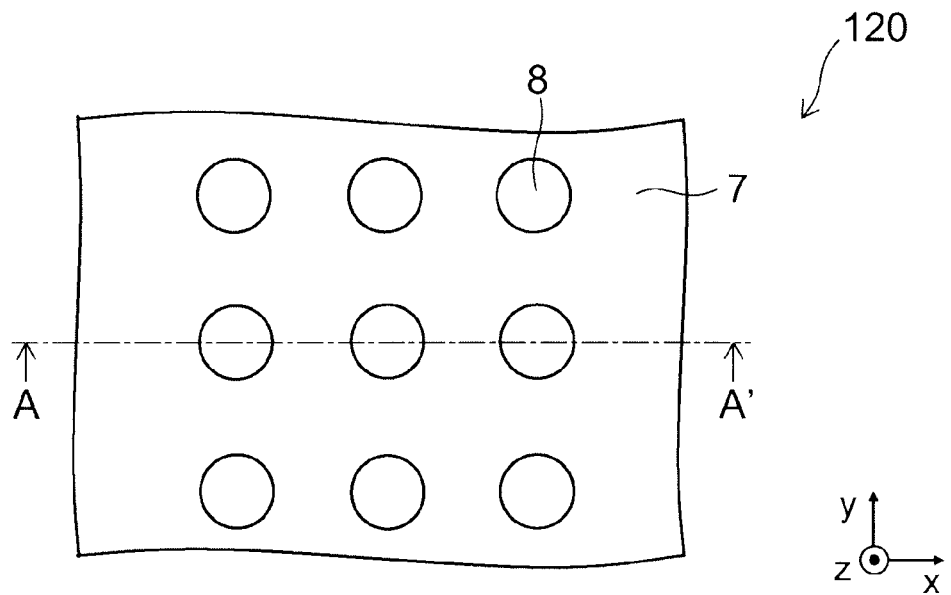
FIGS. 9A and 9B are schematic views illustrating the configuration of a nonvolatile memory device according to another embodiment of the invention.
Figure 9B:
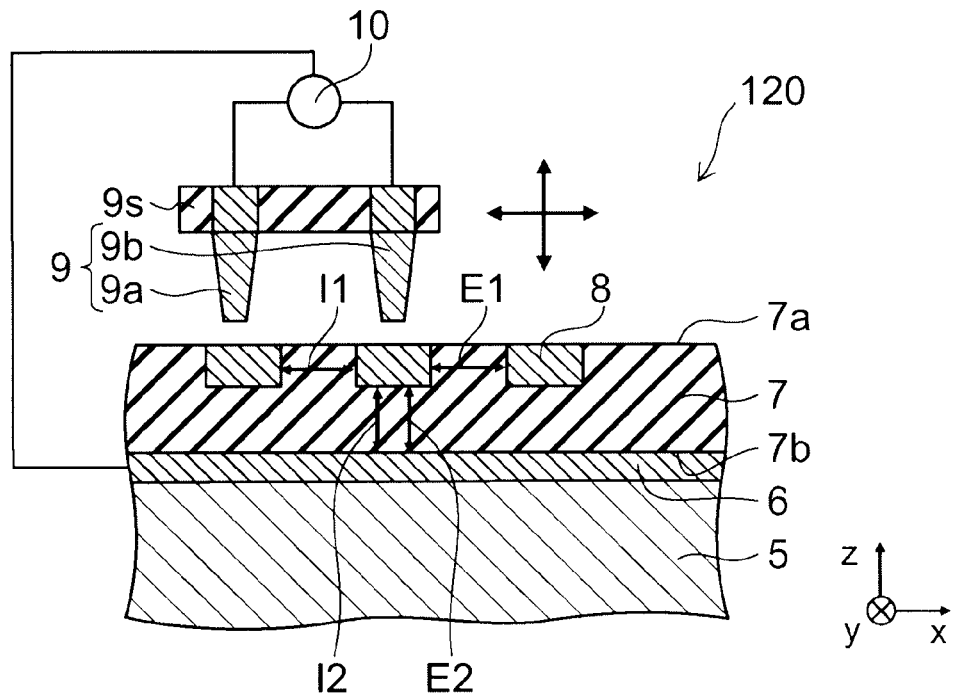

FIGS. 9A and 9B are schematic views illustrating the configuration of a nonvolatile memory device according to another embodiment of the invention.

Namely, FIG. 9A is a plan view; and FIG. 9B is a cross-sectional view along line A-A' of FIG. 9A.

As illustrated in FIGS. 9A and 9B, a nonvolatile memory device 120 according to the another embodiment of the invention further includes a second electrode 6 provided on a second major surface 7b on a side of the memory layer 7 opposite to the first major surface 7a of the nonvolatile memory device 110 of the embodiment. The drive unit 10 is further connected to the second electrode 6.

The drive unit 10 further performs at least one selected from applying an electric field (e.g., an electric field E2) and providing a current (e.g., a current I2) between the second electrode 6 and at least one of the multiple probe electrodes 9a. Otherwise, the nonvolatile memory device 120 may be similar to the nonvolatile memory device 110, and a description is omitted.

The second electrode 6 may include, for example, platinum. However, the invention is not limited thereto. The second electrode 6 may include any electrically conductive material.

Thus, the nonvolatile memory device 120 further includes the second electrode 6 provided on the second major surface 7b of the memory layer 7. Therefore, in addition to applying the electric field E1 or the current I1 to the memory layer 7 in a plane parallel to the first major surface 7a described in the nonvolatile memory device 110, the electric field E2 or the current I2 can be applied to the memory layer 7 in a direction perpendicular to the first major surface 7a. Thereby, more memory cells can be formed among the multiple first electrodes 8 and the second electrode 6.

Thus, in the nonvolatile memory device 120, the resistance of the memory layer 7 between the multiple first electrodes 8 and the resistance of the memory layer 7 between the second electrode 6 and at least one of the multiple first electrodes 8 can be used as different memory components (memory cells).

Thereby, in addition to the total of $(n-1) \times m + n \times (m-1) + 2 \times (n-1) \times (m-1)$ memory cells formed in directions parallel to the first major surface 7a as illustrated in FIGS. 4A and 4B, $(n \times m)$ memory cells can be formed in directions perpendicular to the first major surface 7a.

Thus, according to the nonvolatile memory device 120 of this embodiment, a resistance change nonvolatile memory device capable of high density information recording can be provided.

As in the nonvolatile memory device 120, when writing and erasing are performed on the memory cell formed between the first electrode 8 and the second electrode 6 in the perpendicular direction for the case where memory cells between the first electrodes 8 in the parallel direction are operated by providing the electric field E1 or the current I1 to the memory layer 7 in a plane parallel to the first major surface 7a and memory cells between the first electrode 8 and the second electrode 6 in the perpendicular direction are operated by providing the electric field E2 or the current I2 to the memory layer 7 in a direction perpendicular to the first major surface 7a, it is desirable to perform the writing and erasing of the memory cell in the perpendicular direction after the memory cells adjacent thereto in the parallel direction are switched to the high resistance state HRS.

In other words, in the case where a memory cell between a certain first electrode 8 and one other first electrode 8 adjacent thereto in the parallel direction is in the low resistance state LRS, there is a risk that the voltage applied to the certain first electrode 8 may also be applied to the one other adjacent first electrode 8 via the memory cell of the parallel direction resulting in writing or erasing being performed on another memory cell between the one other adjacent first electrode 8 and the second electrode 6 in the perpendicular direction. In such a case, as recited above, the unintentional application of a voltage between the one other first electrode 8 and the second electrode 6 can be suppressed by performing the writing and the erasing of the memory cell of the perpendicular direction after the memory cell of the parallel direction adjacent to the certain memory cell is switched to the high resistance state HRS.

The various cross-sectional structures of the first electrode 8 described in regard to FIGS. 6A to 7B may be applied to the nonvolatile memory device 120 according to this embodiment to obtain similar effects.

Also, the various planar configurations of the first electrode 8 described in regard to FIGS. 8A to 8C may be applied to obtain similar effects.

Figure 10:
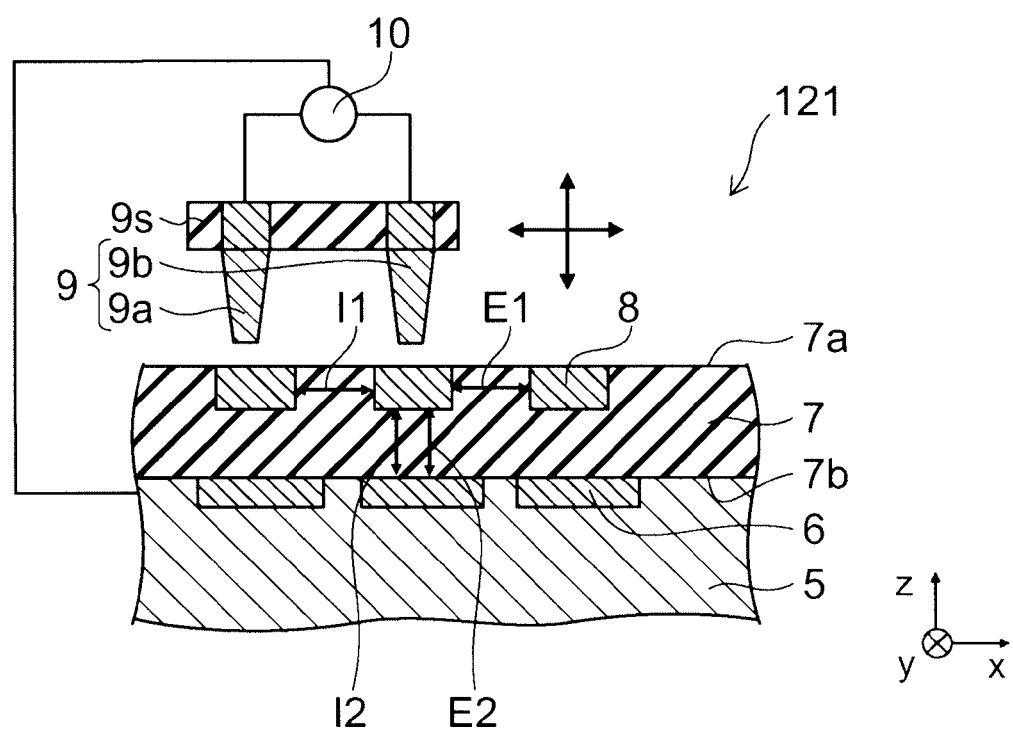
FIG. 10 is a schematic view illustrating the configuration of another nonvolatile memory device according to the another embodiment of the invention.

FIG. 10 is a schematic view illustrating the configuration of another nonvolatile memory device according to the another embodiment of the invention.

Namely, FIG. 10 is a cross-sectional view corresponding to the cross section along line A-A' of FIG. 9A.

In another nonvolatile memory device 121 according to the another embodiment of the invention, the second electrode 6 is multiply provided as illustrated in FIG. 10. Otherwise, the nonvolatile memory device 121 may be similar to the nonvolatile memory device 120, and a description is omitted.

In this specific example, the second electrode 6 is divided along the X axis direction and multiply provided in band configurations aligned in the Y axis direction. Although the second electrode 6 in this specific example is buried in the substrate 5, the second electrode 6 may be buried in the memory layer 7 on the second major surface 7b side of the memory layer 7.

In other words, in the nonvolatile memory device 121, the second electrode 6 is multiply provided on the second major surface 7b; and the drive unit 10 performs at least one selected from applying an electric field and providing a current between at least one of the multiple probe electrodes 9 and at least one of the multiple second electrodes 6.

Thus, by multiply providing the second electrode 6, the direction of the electric field E2 and the current I2 provided between the first electrode 8 and the second electrode 6 can be controlled; and the driving margin can be further enlarged.

In the case where writing and erasing is performed on memory cells in the perpendicular direction formed between the first electrode 8 and the second electrode 6 in the nonvolatile memory device 121 as well, it is desirable to perform the writing and the erasing of the memory cell in the perpendicular direction after switching the memory cells adjacent thereto in the parallel direction to the high resistance state HRS.

Hereinabove, exemplary embodiments of the invention are described with reference to specific examples. However, the invention is not limited to these specific examples. For example, one skilled in the art may appropriately select specific configurations of components of nonvolatile memory devices such as substrates, memory layers, electrodes, probe electrodes, drive units, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile memory devices practicable by an appropriate design modification by one skilled in the art based on the nonvolatile memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A nonvolatile memory device, comprising:
    a memory layer having a resistance changeable by performing at least one selected from applying an electric field and providing a current, the storage layer having a first major surface;
    a plurality of first electrodes provided on the first major surface;
    a plurality of probe electrodes disposed to face the plurality of first electrodes, the plurality of probe electrodes having a changeable relative positional relationship with the first electrodes; and
    a drive unit connected to the plurality of probe electrodes to record information in the memory layer by causing at least the one selected from the electric field and the current between at least two of the plurality of first electrodes via the plurality of probe electrodes, the electric field having a component parallel to the first major surface, the current flowing in a direction having a component parallel to the first major surface,
    wherein a first direction probe electrode pitch is a first direction electrode pitch multiplied by an integer, the first direction electrode pitch being a pitch between the plurality of first electrodes in a first direction parallel to the first major surface, the first direction probe electrode pitch being a pitch in the first direction between tips of each of the plurality of probe electrodes on a side facing the first electrodes.

2. The device according to claim 1, wherein the probe electrodes are configured to be movable in a plane parallel to the first major surface.

3. The device according to claim 1, wherein a second direction probe electrode pitch is a second direction electrode pitch multiplied by an integer, the second direction electrode pitch being a pitch between the plurality of first electrodes in a second direction perpendicular to the first direction and parallel to the first major surface, the second direction probe electrode pitch being a pitch in the second direction between tips of each of the plurality of probe electrodes on a side facing the first electrodes.

4. The device according to claim 1, wherein a surface area of each of the plurality of first electrodes in a plane parallel to the first major surface is larger than a surface area of a tip of the plurality of probe electrodes on a side facing the first major surface.

5. The device according to claim 1, wherein the plurality of first electrodes are buried in the memory layer and exposed at the first major surface.

6. The device according to claim 1, wherein the plurality of first electrodes pierce the memory layer.

7. The device according to claim 1, wherein at least one of the plurality of first electrodes includes a surface having a central portion recessed from a peripheral portion on a side facing the probe electrodes.

8. The device according to claim 1, wherein at least one of the plurality of first electrodes includes a surface having a central portion protruding from a peripheral portion on a side facing the probe electrodes.

9. The device according to claim 1, wherein a planar configuration of the plurality of first electrodes as viewed from a direction perpendicular to the first major surface has a protruding portion to concentrate an electric field between the plurality of first electrodes.

10. A nonvolatile memory device, comprising:
    a memory layer having a resistance changeable by performing at least one selected from applying an electric field and providing a current, the storage layer having a first major surface;
    a plurality of first electrodes provided on the first major surface;
    a plurality of probe electrodes disposed to face the plurality of first electrodes, the plurality of probe electrodes having a changeable relative positional relationship with the first electrodes; and
    a drive unit connected to the plurality of probe electrodes to record information in the memory layer by causing at least the one selected from the electric field and the current between at least two of the plurality of first electrodes via the plurality of probe electrodes, the electric field having a component parallel to the first major surface, the current flowing in a direction having a component parallel to the first major surface,
    wherein the plurality of first electrodes are arranged in a matrix configuration in a first direction in a plane parallel to the first major surface and a second direction perpendicular to the first direction in the plane, and the plurality of probe electrodes are configured to contact the plurality of first electrodes mutually adjacent in at least one direction selected from the first direction and the second direction.

11. The device according to claim 10, wherein a planar configuration of the plurality of first electrodes as viewed from a direction perpendicular to the first major surface includes a protruding portion to concentrate an electric field between the plurality of first electrodes in the at least one direction.

12. The device according to claim 10, wherein the plurality of probe electrodes are configured to further contact the plurality of first electrodes mutually adjacent in a direction different from the first direction and the second direction.

13. The device according to claim 12, wherein a planar configuration of the plurality of first electrodes as viewed from a direction perpendicular to the first major surface includes a protruding configuration to concentrate an electric field between the plurality of first electrodes in the direction different from the first direction and the second direction.

14. A nonvolatile memory device, comprising:
a memory layer having a resistance changeable by performing at least one selected from applying an electric field and providing a current, the storage layer having a first major surface;
a plurality of first electrodes provided on the first major surface;
a plurality of probe electrodes disposed to face the plurality of first electrodes, the plurality of probe electrodes having a changeable relative positional relationship with the first electrodes;
a drive unit connected to the plurality of probe electrodes to record information in the memory layer by causing at least the one selected from the electric field and the current between at least two of the plurality of first electrodes via the plurality of probe electrodes, the electric field having a component parallel to the first major surface, the current flowing in a direction having a component parallel to the first major surface, and
a second electrode provided on a second major surface on a side of the memory layer opposite to the first major surface, the drive unit further performing at least one selected from applying an electric field and providing a current between the second electrode and at least one of the plurality of probe electrodes.

15. The device according to claim 14, wherein a resistance of the memory layer between the plurality of first electrodes and a resistance of the memory layer between the second electrode and at least one of the plurality of first electrodes are used as different memory components.

16. The device according to claim 14, wherein the second electrode is multiply provided on the second major surface, and the drive unit performs at least one selected from applying an electric field and providing a current between at least one of the plurality of first electrodes and at least one of the plurality of second electrodes.

17. The device according to claim 16, wherein
the plurality of first electrodes are mutually divided along a first direction parallel to the first major surface, and
the plurality of second electrodes are divided along the first direction and has a band configuration aligned in a second direction perpendicular to the first direction and parallel to the first major surface.

18. The device according to claim 1, wherein the memory layer includes at least one selected from a resistance change material and a phase change material.

19. The device according to claim 1, wherein the memory layer includes at least one selected from the group consisting of $NiO_x$, $TiO_x$, $CoO_x$, $TaO_x$, $MnO_x$, $WO_x$, $Al_2O_3$, $FeO_x$, $HfO_x$, $ZnMn_2O_4$, $ZnFe_2O_4$, $ZnCo_2O_4$, $ZnCr_2O_4$, $ZnAl_2O_4$, $CuCoO_2$, $CuAlO_2$, $NiWO_4$, $NiTiO_3$, $CoAl_2O_4$, $MnAl_2O_4$, $ZnNiTiO_4$, $Pr_xCa_{1-x}MnO_3$ and SiC.

* * * * *